(12) United States Patent
Akarvardar et al.

(10) Patent No.: US 9,245,980 B2
(45) Date of Patent: Jan. 26, 2016

(54) METHODS OF FORMING SUBSTANTIALLY DEFECT-FREE, FULLY-STRAINED SILICON-GERMANIUM FINS FOR A FINFET SEMICONDUCTOR DEVICE

(71) Applicant: GLOBALFOUNDRIES Inc., Grand Cayman (KY)

(72) Inventors: Murat Kerem Akarvardar, Saratoga Springs, NY (US); Jody A. Fronheiser, Delmar, NY (US); Ajey Poovannummoottil Jacob, Watervliet, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 121 days.

(21) Appl. No.: 14/242,472

(22) Filed: Apr. 1, 2014

(65) Prior Publication Data
US 2015/0279973 A1    Oct. 1, 2015

(51) Int. Cl.
*H01L 29/66*    (2006.01)
*H01L 21/84*    (2006.01)
*H01L 29/10*    (2006.01)

(52) U.S. Cl.
CPC ........ *H01L 29/66795* (2013.01); *H01L 21/845* (2013.01); *H01L 29/1054* (2013.01)

(58) Field of Classification Search
CPC ............ H01L 27/10826; H01L 29/785; H01L 27/10879
See application file for complete search history.

(56) References Cited

U.S. PATENT DOCUMENTS

| | | |
|---|---|---|
| 2009/0321836 A1 | 12/2009 | Wei et al. |
| 2010/0072515 A1 | 3/2010 | Park et al. |
| 2011/0097881 A1 | 4/2011 | Vandervorst et al. |
| 2011/0183508 A1 | 7/2011 | Chan et al. |
| 2013/0270628 A1 | 10/2013 | Huang et al. |
| 2015/0194525 A1* | 7/2015 | Xu .................... H01L 29/66795 257/192 |

OTHER PUBLICATIONS

Cheng et al., "Aspect Ratio Trapping Heteroepitaxy for Integration of Germanium and Compound Semiconductors on Silicon," IEEE 2008.
Houghton et al., "Equilibrium critical thickness for Si1-xGex strained layers on (100) Si," Appl. Phys. Lett., 56:460-62, Jan. 1990.
Jain et al., "A new study of critical layer thickness, stability and strain relaxation in pseudomorphic GexSi1-x strained epilayers," Philosophical Magazine A, 65:1151-67, 1992.

(Continued)

*Primary Examiner* — Mohammad Choudhry
(74) *Attorney, Agent, or Firm* — Amerson Law Firm, PLLC (57) ABSTRACT

One illustrative method disclosed herein includes, among other things, performing an epitaxial deposition process to form an epi SiGe layer above a recessed layer of insulating material and on an exposed portion of a fin, wherein the concentration of germanium in the layer of epi silicon-germanium ($Si_xGe_{1-x}$) is equal to or greater than a target concentration of germanium for the final fin, performing a thermal anneal process in an inert processing environment to cause germanium in the epi SiGe to diffuse into the fin and thereby define an SiGe region in the fin, after performing the thermal anneal process, performing at least one process operation to remove the epi SiGe and, after removing the epi SiGe, forming a gate structure around at least a portion of the SiGe region.

16 Claims, 10 Drawing Sheets

(56) References Cited

OTHER PUBLICATIONS

Kasper et al., "Strain relaxation of metastable SiGe/Si: Investigation with two complementary X-ray techniques," Journal of Applied Physics, 111:063507, 2012.
Kim et al., "Increased critical thickness for high Ge-content strained SiGe-on-Si using selective epitaxial growth," Applied Physics Letters, 97:262106, 2012.
Paul, "Silicon—Germanium Strained Layer Materials in Microelectronics," Advanced Materials, 11:191-204, 1999.
Paul, "Si/SiGe heterostructures: From material and physics to devices and circuits," Review Article submitted to Semicond. Sci. Technol.

* cited by examiner

METHODS OF FORMING SUBSTANTIALLY DEFECT-FREE, FULLY-STRAINED SILICON-GERMANIUM FINS FOR A FINFET SEMICONDUCTOR DEVICE

BACKGROUND OF THE INVENTION

1. Field of the Invention

Generally, the present disclosure relates to the manufacture of FET semiconductor devices, and, more specifically, to various methods of forming substantially defect-free, fully strained silicon-germanium fins for a FinFET semiconductor device.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A conventional FET is a planar device that typically includes a source region, a drain region and a channel region that is positioned between the source region and the drain region, and a gate electrode positioned above the channel region. Current flow through the FET is controlled by controlling the voltage applied to the gate electrode. For example, for an NMOS device, if there is no voltage applied to the gate electrode, then there is no current flow through the NMOS device (ignoring undesirable leakage currents, which are relatively small). However, when an appropriate positive voltage is applied to the gate electrode, the channel region of the NMOS device becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the past decades. More specifically, the channel length of FETs has been significantly decreased, which has resulted in improving the switching speed and in lowering operation currents and voltages of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

Figure 1A:
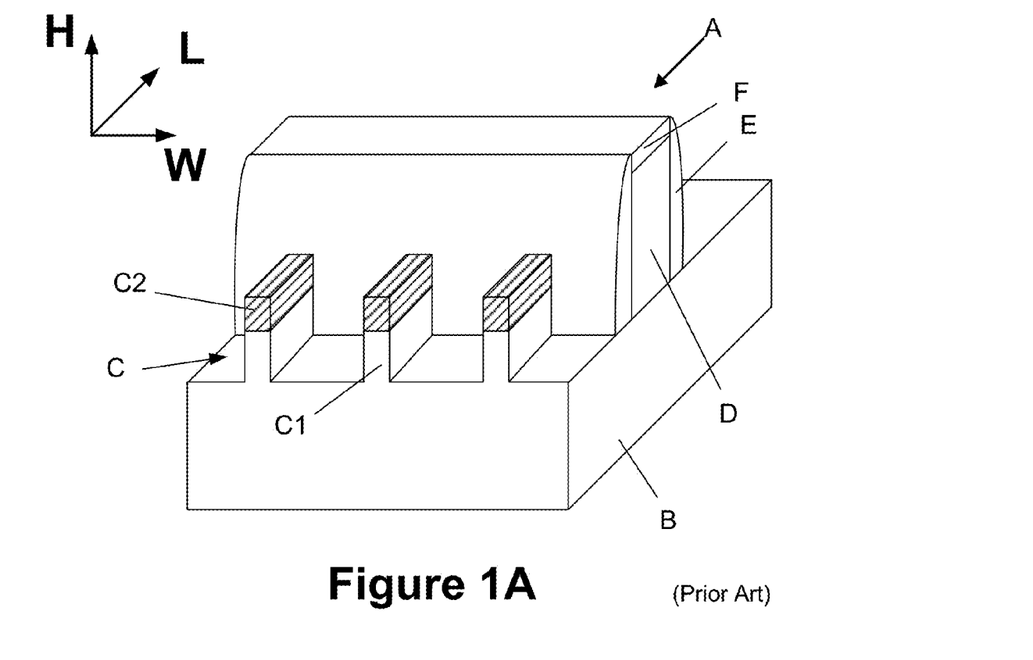
FIGS. 1A-1C depict examples of prior art FinFET devices wherein the fins for the device are comprised of an alternative fin material formed above a substrate fin.

In contrast to a planar FET, there are so-called 3D devices, such as an illustrative FinFET device, which is a three-dimensional structure. FIG. 1A is a perspective view of an illustrative prior art FinFET semiconductor device A that is formed above a semiconductor substrate B. The device A includes three illustrative fins C, a gate structure D, sidewall spacers E and a gate cap layer F. The gate structure D is typically comprised of a layer of insulating material (not separately shown), e.g., a layer of high-k insulating material, and one or more conductive material layers that serve as the gate electrode for the device A. In this example, the fins C are comprised of a substrate fin portion C1 and an alternative fin material portion C2. The substrate fin portion C1 may be made of silicon, i.e., the same material as the substrate, and the alternative fin material portion C2 may be made of a material other than the substrate material, for example, silicon-germanium. The fins C have a three dimensional configuration: a height H, a width W and an axial length L. The axial length L corresponds to the direction of current travel in the device A when it is operational. The portions of the fins C covered by the gate structure D are the channel regions of the FinFET device A. In a conventional process flow, the portions of the fins C that are positioned outside of the spacers E, i.e., in the source/drain regions of the device A, may be increased in size or even merged together (not shown in FIG. 1A) by performing one or more epitaxial growth processes. The process of increasing the size of or merging the fins C in the source/drain regions of the device A is performed to reduce the resistance of source/drain regions and/or make it easier to establish electrical contact to the source drain regions.

In the FinFET device A, the gate structure D encloses both sides and the upper surface of all or a portion of the fins C to form a tri-gate structure so as to use a channel having a three-dimensional structure instead of a planar structure. In some cases, an insulating cap layer, e.g., silicon nitride is positioned at the top of the fins C and the FinFET device only has a dual-gate structure (sidewalls only). Unlike a planar FET, in a FinFET device, a channel is formed perpendicular to a surface of the semiconducting substrate so as to increase the drive current per footprint of the device. Also, in a FinFET, the improved gate control through multiple gates on a narrow, fully-depleted semiconductor fin significantly reduces the short channel effects. When an appropriate voltage is applied to the gate electrode of a FinFET device, the surfaces (and the inner portion near the surface) of the fins C, i.e., the vertically oriented sidewalls and the top upper surface of the fin, form a surface inversion layer or a volume inversion layer that contributes to current conduction. In a FinFET device, the "channel-width" is estimated to be about two times (2x) the vertical fin-height plus the width of the top surface of the fin, i.e., the fin width. Multiple fins can be formed in the same foot-print as that of a planar transistor device. Accordingly, for a given plot space (or foot-print), FinFETs tend to be able to generate significantly higher drive current than planar transistor devices. Additionally, the leakage current of FinFET devices after the device is turned "OFF" is significantly reduced as compared to the leakage current of planar FETs, due to the superior gate electrostatic control of the "fin" channel on FinFET devices. In short, the 3D structure of a FinFET device is a superior MOSFET structure as compared to that of a planar FET, especially in the 20 nm CMOS technology node and beyond.

Device manufacturers are under constant pressure to produce integrated circuit products with increased performance and lower production costs relative to previous device generations. Thus, device designers spend a great amount of time and effort to maximize device performance while seeking ways to reduce manufacturing costs and improve manufacturing reliability. As it relates to 3D devices, device designers have spent many years and employed a variety of techniques in an effort to improve the performance, capability and reliability of such devices. Device designers are currently investigating using alternative semiconductor materials, such as so-called SiGe, Ge and III-V materials, to manufacture FinFET devices which are intended to enhance the performance capabilities of such devices, e.g., to enable low-voltage operation without degrading their operating speed.

However, the integration of such alternative materials on silicon substrates (the dominant substrates used in the industry) is non-trivial due to, among other issues, the large difference in lattice constants between such alternative materials and silicon. That is, with reference to FIG. 1A, the lattice constant of the alternative fin material portion C2 of the fin C may be substantially greater than the lattice constant of the substrate fin portion C1 of the fin C. As a result of this mismatch in lattice constants, an unacceptable number of defects may be formed or created in the alternative fin material portion C2. As used herein and in the claims attached hereto, a "defect" essentially refers to a misfit dislocation at the interface between the portions C1 and C2 of the fin C or threading dislocations that propagate through the portion C2 on the fin C at well-defined angles corresponding to the (111) plane.

With respect to forming such lattice-mismatched materials on one another, there is a concept that is generally referred to as the "critical thickness" of a material. The term "critical thickness" generally refers to materials that are in one of three conditions, i.e., so-called "stable," "metastable" or "relaxed-with-defects" conditions. These three conditions also generally reflect the state of the strain on the material. That is, a stable material is in a fully-strained condition that is 100% strained in at least one crystalline plane of the material.

Figure 1B:
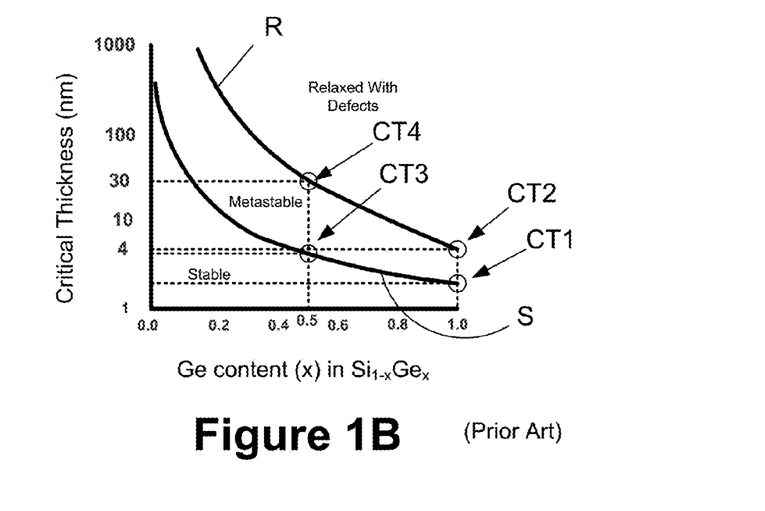

FIG. 1B is a graph taken from an article entitled "Silicon-Germanium Strained Layer Materials in Microelectronics" by Douglas J. Paul that was published in *Advanced Materials* magazine (11(3), 101-204 (1999)). FIG. 1B graphically depicts these three conditions for blank (unpatterned) silicon-germanium materials ($Si_{1-x}Ge_x$; x=0-1). The vertical axis is the critical thickness in nanometers. The horizontal axis is the concentration of germanium in the silicon-germanium material. At the leftmost point on the horizontal axis is pure silicon (Ge concentration equals 0.0). At the rightmost point on the horizontal axis is pure germanium (Ge concentration equals 1.0). The two curves R and S define the stable, metastable and relaxed-with-defects regions for silicon-germanium materials having differing germanium concentration levels. Above and to the right of curve R are materials that are in the relaxed-with-defects condition. Below and to the left of the curve S are materials that are in the stable condition. The region between the two curves R and S defines the region where materials are in the metastable condition.

With reference to FIG. 1B, a layer of pure germanium (Ge concentration equal to 1.0) may be in the stable condition at a thickness up to about 1-2 nm (point CT1) and it may relax beyond about 4 nm (point CT2). Between about 2-4 nm, germanium is in a so-called "metastable condition" meaning it can easily relax if it is subjected to a relatively high temperature anneal. In contrast, a layer of silicon-germanium with a 50% concentration of germanium may be in the stable condition at thicknesses up to about 4 nm (point CT3) and it may be in a metastable condition for thicknesses between about 4-30 nm (point CT4). Above a thickness of about 30 nm, a layer of silicon-germanium with a 50% concentration of germanium will be in the relaxed-with-defects condition.

Figure 1C:
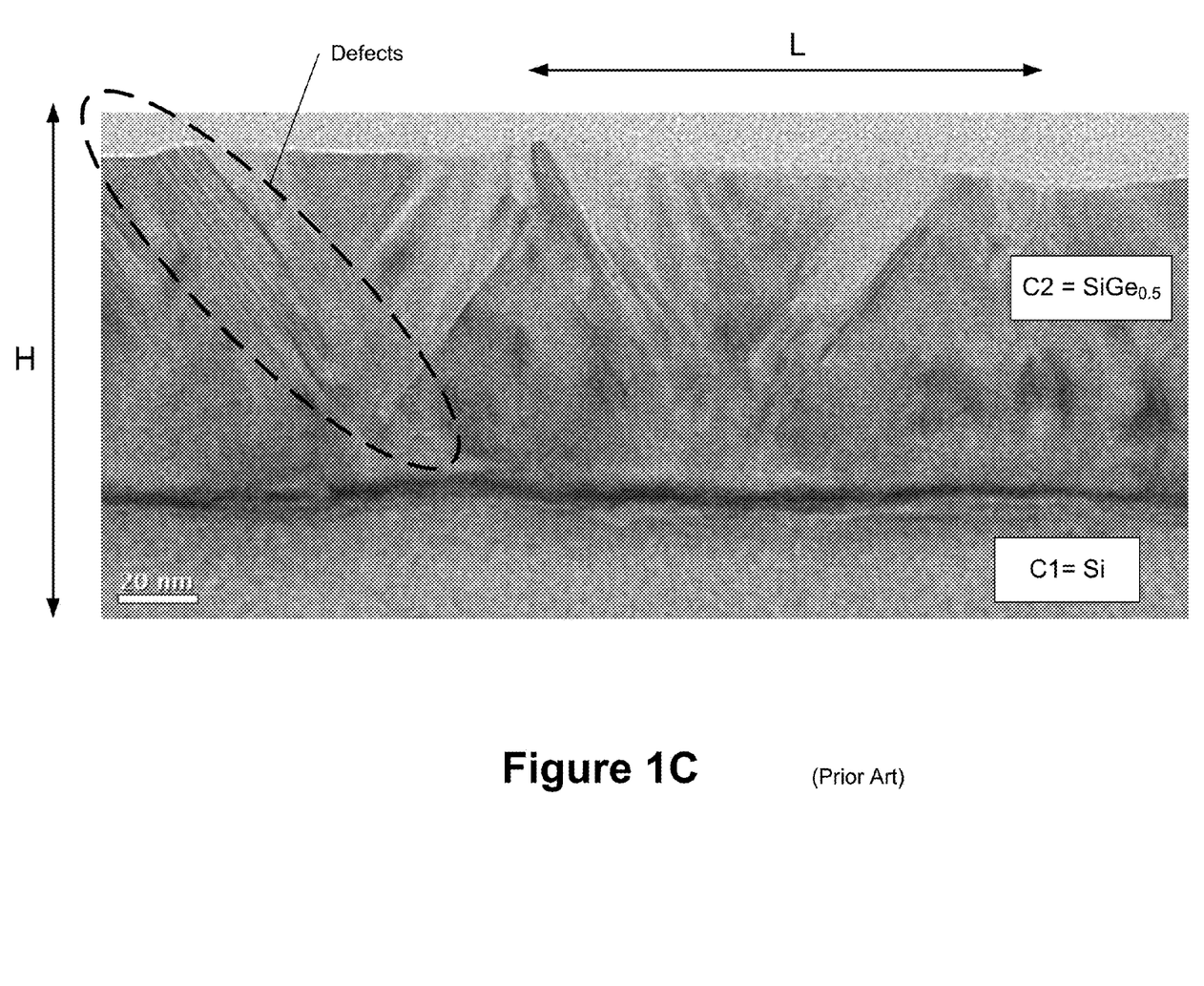

A material that is in the relaxed-with-defects condition is a material that contains visible defects that are indicative that the material has relaxed to the point where defects have been formed in the material. For example, FIG. 1C is a TEM photograph of a cross-sectioned fin of a FinFET device (taken along the axial length "L" of the fin) wherein the substrate fin C1 is comprised of silicon and the alternative fin material portion C2 of the fin is comprised of silicon-germanium with a 50% concentration of germanium ($SiGe_{0.5}$). The axial length direction "L" and height direction "H" of the fin are indicated in FIG. 1C. In this example, the thickness or height "H" of the alternative fin material C2 was about 30 nm, a thickness greater than the metastable critical thickness for the blank (unpatterned) growth of this material (which is about 30 nm according to FIG. 1B). Accordingly, the alternative fin material C2 is in the relaxed-with-defects condition and defects are visible throughout the alternative fin material C2 and at the interface between the materials C1/C2. Thus, in the example, the alternative fin material C2 shown in FIG. 1C is fully relaxed in all three directions—axial length L, height H and width W, i.e., it is in the relaxed-with-defects condition.

The presence of defects in an alternative material fin structure would be detrimental to device operations. One process that has been investigated for use in forming such alternative fin materials is known as aspect-ratio-trapping (ART). In general, the ART process involves forming a masking layer, such as silicon dioxide, above a semiconductor substrate, such as silicon, patterning the masking layer to define a trench that exposes the underlying substrate, and performing an epitaxial growth process to form an alternative fin material, e.g., silicon-germanium, on the exposed substrate, wherein the growth is confined within the trench. That is, the ART process involves epitaxially growing fully relaxed, unstrained material hetero-structures in a high aspect-ratio silicon dioxide trench having an aspect ratio of 5 or greater in an attempt to decrease defects. In some applications, the ART process may involve the formation of trenches that have a very high aspect ratio, e.g., about 25-30. Importantly, in the ART process, the trench is made deep enough such that defects generated in the alternative fin material will be trapped at or near the bottom of the original trench and in the sidewalls of the trench positioned slightly above the interface between the substrate material and the alternative fin material. The amount of defects generated and the propagation of such defects will depend upon the crystal orientation of the substrate. The intent of the ART process is that, while the defect-containing fin material is present at or near the bottom of the trench, the upper-most portions of the epitaxially grown alternative fin material will be substantially defect-free material but, importantly, it is an un-strained material. That is, the alternative fin material is fully relaxed in all crystalline planes, e.g., in the crystalline planes that correspond to the axial length direction, height direction and width direction of the fin. This occurs due to the "trapping" of the defects at or near the bottom of the trench, with the result being the formation of substantially defect-free alternative fin material above the defective-containing portions of the alternative fin material in the lower portion of the trench. In principle, the ART process does not present a limitation with respect to the thickness of the lattice-mismatched layer, which is typically fully relaxed, a few 100 nm thick, and with defects intentionally confined close to the bottom interface. The defects are generated along the (111) crystallographic direction of the alternative fin material and they are captured or stopped by the sidewalls of the trench.

In one particular example, as it relates to the formation of P-type FinFET devices, device designers have investigated the use of pure germanium and silicon-germanium, along with a high uniaxial compressive stress, as the fin material so as to improve charge carrier (i.e., holes) mobility in the devices. To be effective, the germanium or silicon-germanium fin material will ideally be formed in a highly-strained, substantially defect-free condition. Several prior art techniques have been attempted in an effort to form such materials, e.g., blanket growth of a germanium or silicon-germanium material on a stress relaxation buffer layer having an intermediate lattice constant between the fin material and the silicon substrate, cladding processes, cladding plus condensation thermal treatment, replacement fin techniques, etc. Unfortunately, the prior art techniques have yet to be able to form highly-strained, substantially defect-free germanium or silicon-germanium in a sufficient thickness so that it may be used in actual devices. In addition, many of the above-mentioned prior art processing techniques are generally incompatible in terms of the thermal budget required to practice the conventional Si baseline integration flows on bulk substrate materials.

The present disclosure is directed to various methods of forming substantially defect-free, fully strained silicon-germanium fins for a FinFET semiconductor device that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming substantially defect-free silicon-germanium fins for a FinFET semiconductor device. One illustrative method disclosed herein includes, among other things, forming a plurality of trenches in a silicon substrate to thereby define a fin, forming a recessed layer of insulating material in the trenches, the recessed surface of the layer of insulating material exposing a portion of the fin, performing an epitaxial deposition process to form a layer of epi silicon-germanium ($Si_xGe_{1-x}$) above the recessed layer of insulating material and on the exposed portion of the fin, wherein the concentration of germanium in the layer of epi silicon-germanium ($Si_xGe_{1-x}$) is equal to or greater than a target concentration of germanium for the final fin, performing a thermal anneal process in an inert processing environment to cause germanium in the layer of epi silicon-germanium ($Si_xGe_{1-x}$) to diffuse into the fin and thereby define a substantially defect-free silicon-germanium region in the fin, after performing the thermal anneal process, performing at least one process operation to remove the layer of epi silicon-germanium ($Si_xGe_{1-x}$), after removing the layer of epi silicon-germanium ($Si_xGe_{1-x}$), recessing the layer of insulating material to expose a portion of the silicon-germanium region and forming a gate structure around at least a portion of the exposed silicon-germanium region.

Another illustrative method disclosed herein includes, among other things, forming a plurality of trenches in a silicon substrate to thereby define a fin, forming a recessed layer of insulating material in the trenches, the recessed surface of the layer of insulating material exposing a portion of the fin, performing an epitaxial deposition process to form a layer of epi silicon-germanium ($Si_xGe_{1-x}$) above the recessed layer of insulating material and on the exposed portion of the fin, wherein the concentration of germanium in the layer of epi silicon-germanium ($Si_xGe_{1-x}$) is equal to or greater than a target concentration of germanium for the final fin, performing an oxidation process to convert at least a portion of the layer of epi silicon-germanium ($Si_xGe_{1-x}$) into an oxide and to cause germanium in the layer of epi silicon-germanium ($Si_xGe_{1-x}$) to diffuse into the fin and thereby define a substantially defect-free silicon-germanium region in the fin, after performing the oxidation process, performing at least one removal process operation to remove the oxidized portions of the layer of epi silicon-germanium ($Si_xGe_{1-x}$) and any remaining portions of the layer of epi silicon-germanium ($Si_xGe_{1-x}$) and, after performing the at least one removal process operation, forming a gate structure around at least a portion of the silicon-germanium region.

Yet another illustrative method disclosed herein includes, among other things, forming a plurality of trenches in a silicon substrate to thereby define a fin, forming a recessed layer of insulating material in the trenches, the layer of insulating material having an upper surface that is substantially planar with an upper surface of the fin, performing an etching process to remove a portion, but not all, of the fin so as to form a fin cavity that is defined by the layer of insulating material and a recessed upper surface of the fin, performing an epitaxial deposition process to form a layer of epi silicon-germanium ($Si_xGe_{1-x}$) in the fin cavity and on the recessed upper surface of the fin, wherein the concentration of germanium in the layer of epi silicon-germanium ($Si_xGe_{1-x}$) is equal to or greater than a target concentration of germanium for the final fin, performing an oxidation process to convert at least a portion of the layer of epi silicon-germanium ($Si_xGe_{1-x}$) into an oxide and to cause germanium in the layer of epi silicon-germanium ($Si_xGe_{1-x}$) to diffuse into the fin and thereby define a substantially defect-free silicon-germanium region in the fin, after performing the oxidation process, performing at least one removal process operation to remove the oxidized portions of the layer of epi silicon-germanium ($Si_xGe_{1-x}$) and any remaining portions of the layer of epi silicon-germanium ($Si_xGe_{1-x}$) and to recess the layer of insulating material so as to expose at least a portion of the silicon-germanium region and, after performing the at least one removal process operation, forming a gate structure around at least a portion of the silicon-germanium region.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming substantially defect-free, fully strained silicon-germanium fins for a FinFET semiconductor device. The methods disclosed herein may be employed in manufacturing either an N-type device or a P-type device, and the gate structure of such devices may be formed using either so-called "gate-first" or "replacement gate" ("gate-last" or "gate-metal-last") techniques. As will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. With reference to the attached figures, various illustrative embodiments of the methods and devices disclosed herein will now be described in more detail.

In the attached drawings, the device 100 is depicted as being formed above a semiconductor substrate 102 comprised of a semiconductor material, such as, for example, a bulk silicon substrate. Thus, the terms "substrate," "semiconductor substrate" or "semiconducting substrate" should be understood to cover all semiconductor materials. An isolation material (not shown) may be formed in the substrate 102 to define illustrative spaced-apart active regions in the substrate 102. The isolation regions may be formed using traditional techniques, e.g., traditional shallow trench isolation regions may be formed in the substrate 102. In the case of the illustrative FinFET devices disclosed herein, the isolation regions may be formed before or after the formation of the fin structures that will be formed as described more fully below.

Figure 2A:
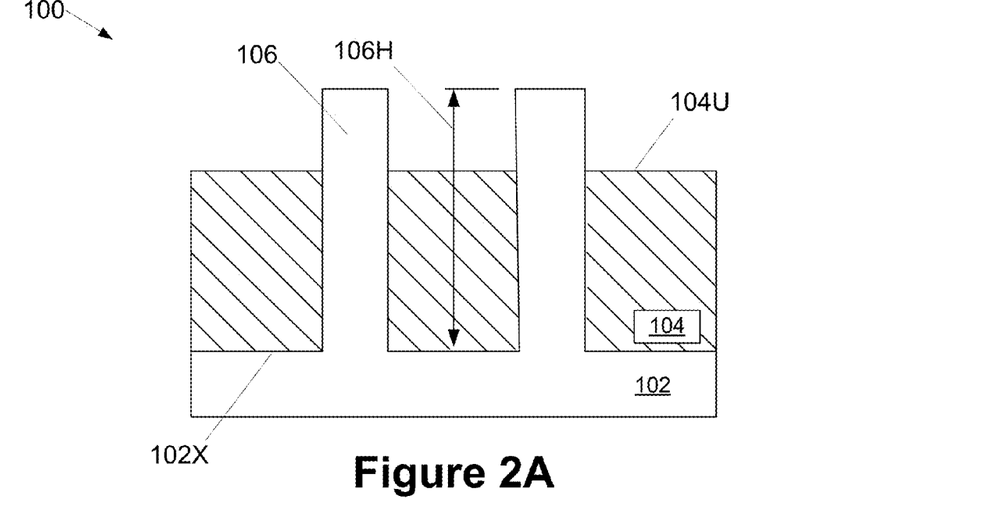
FIGS. 2A-2F depict various illustrative novel methods disclosed herein for forming substantially defect-free, fully strained silicon-germanium fins for a FinFET semiconductor device.

The silicon-germanium ($Si_xGe_{1-x}$) fins disclosed herein may be formed using a variety of techniques. FIGS. 2A-2F depict various illustrative novel methods disclosed herein for forming substantially defect-free silicon-germanium fins for a FinFET semiconductor device. FIG. 2A depicts the device 100 after several process operations were performed. First, one or more etching processes, e.g., anisotropic etching processes, were performed through a patterned etch mask (not shown) to define a plurality of fin-formation trenches 102X in the substrate 102. The formation of the trenches 102X results in the formation of a plurality of initial fin structures 106. Thereafter, a recessed layer of insulating material 104, such as a layer of silicon dioxide, was formed in the trenches 102X between the fins 106. In one illustrative embodiment, the recessed layer of insulating material 104 may be formed by blanket depositing the initial layer of insulating material across the device so as to over-fill the trenches 102X. Thereafter, an optional chemical mechanical polishing (CMP) process may be performed to planarize the upper surface of the layer of material 104. Then, a timed, recessing etch-back process may be performed on the layer of insulating material to recess the upper surface 104U of the layer of insulating material 104 to the desired height level, thereby exposing a desired amount of the fins 106 above the recessed surface 104U. The layer of material 104 may be comprised of a variety of different materials, such as silicon dioxide, etc., and it may be formed by performing a variety of techniques, e.g., chemical vapor deposition (CVD), etc.

The width and height of the fin structures 106 may vary depending upon the particular application. Additionally, the overall size, shape and configuration of the fin-formation trenches 102X and fins 106 may vary depending on the particular application. In one illustrative embodiment, based on current day technology, the depth of the trenches 102X may range from approximately 50-200 nm and the width of the trenches 102X may be about 30 nm or less. In some embodiments, the fins 106 may have a final width within the range of about 10 nm. As will be appreciated by those skilled in the art after a complete reading of the present application, in some embodiments disclosed herein, the overall height of the fins 106H can be incrementally made larger than what would normally be sufficient for isolation purposes. For example, if the "normal" fin height used in a particular process flow or product was traditionally about 100 nm, then in some of the embodiments disclosed herein, the overall height 106H of the fin may be increased by about 30 nm. Of course, the above numbers are provided by way of example, and the formation of increased-height fins is not required to practice at least some of the several inventions disclosed herein.

In the illustrative examples depicted in the attached drawings, the fin-formation trenches 102X and fins 106 are all depicted as having a uniform size and shape. However, such uniformity in the size and shape of the fin-formation trenches 102X and the fins 106 is not required to practice at least some aspects of the inventions disclosed herein. In the attached figures, the fin-formation trenches 102X are depicted as having been formed by performing an anisotropic etching process that results in the fin-formation trenches 102X having a schematically depicted, generally rectangular configuration. In an actual real-world device, the sidewalls of the fin-formation trenches 102X may be somewhat inwardly tapered, although that configuration is not depicted in the attached drawings. In some cases, the fin-formation trenches 102X may have a reentrant profile (not shown) near the bottom of the fin-formation trenches 102X. To the extent the fin-formation trenches 102X are formed by performing a wet etching process, the fin-formation trenches 102X may tend to have a more rounded configuration or non-linear configuration as compared to the generally rectangular configuration of the fin-formation trenches 102X that are formed by performing an anisotropic etching process. Thus, the size and configuration of the fin-formation trenches 102X, and the manner in which they are made, as well as the general configuration of the fins 106, should not be considered a limitation of the present invention. For ease of disclosure, only the substantially rectangular fin-formation trenches 102X and fins 106 will be depicted in the subsequent drawings. Moreover, the device 100 may be formed with any desired number of fins 106.

Figure 2B:
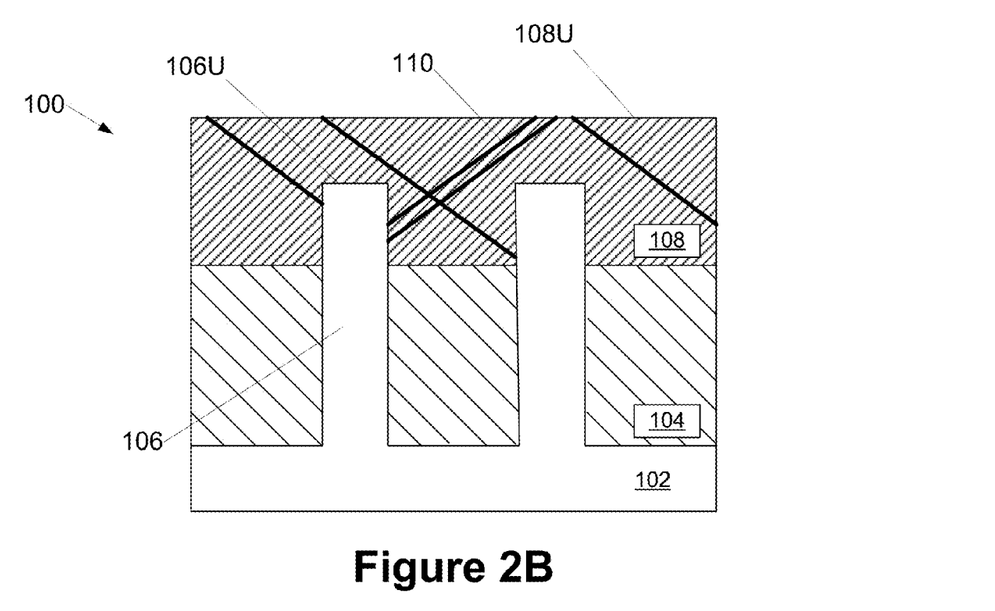
Figure 2C:
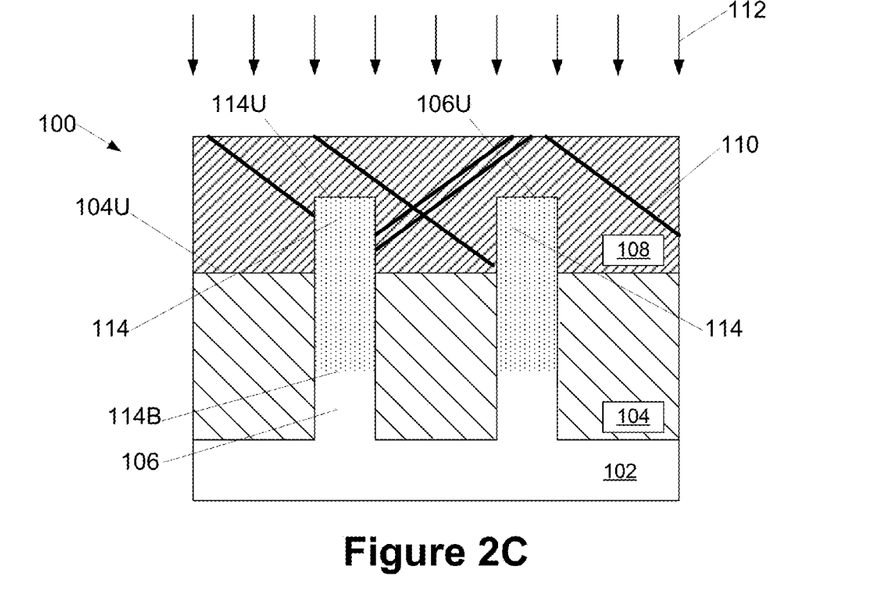

FIG. 2B depicts the device 100 after an epitaxially grown layer of silicon-germanium ($Si_xGe_{1-x}$) 108 (hereinafter "SiGe layer 108") was formed on the device 100. The SiGe layer 108 may be formed using traditional epitaxial deposition tools and techniques, and it may be formed to any desired thickness. In one illustrative embodiment, the SiGe layer 108 is formed with a thickness such that its upper surface 108U is positioned approximately 50-100 nm above the upper surface 106U of the fins 106. In general, the germanium concentration percentage in the SiGe layer 108 should be equal to or greater than the desired concentration of germanium in the final fin, i.e., the final target concentration of germanium in the fin. In general, the target germanium concentration for the final fin may range from about 40-100%, depending upon the particular application. As will be appreciated by those skilled in the art after a complete reading of the present application, the SiGe layer 108 will serve as a "source" through which the germanium will be "pushed" into at least a portion of the fins 106. Also depicted in FIG. 2B are illustrative and simplistically depicted fault lines or defects 110 that are likely to be present in the SiGe layer 108 due to the thickness to which it is formed and the oxide surfaces with which the SiGe layer 108 interacts. The angled fault lines or defects 110 typically travel along a particular crystallographic plane of the SiGe layer 108, e.g., the (111) plane. The fault lines or defects 110 tend to stop at the interface where they hit the fins 106 and where they intersect with the layer of insulating material 104. Ideally, the upper surface 108U of the SiGe layer 108 will be relatively flat. This can be accomplished by controlling the epi deposition process FIG. 2C depicts the device 100 after a thermal anneal process 112 was performed on the FinFET device 100. The thermal anneal process 112 may be performed in a non-oxidizing process ambient, e.g., an inert gas ambient, such as nitrogen, if desired. Optionally, an insulator cap layer (not shown) can be deposited before the anneal process 112 is performed in order to prevent or reduce germanium out-diffusion. In general, the purpose of the thermal anneal process 112 is to cause the germanium in the SiGe layer 108 to diffuse into the fins 106 and thereby form silicon-germanium ($Si_xGe_{1-x}$) regions 114 (hereinafter "SiGe regions 114") in the fins 106. The germanium in the SiGe layer 108 will preferentially migrate into the silicon fins 106 as opposed to the layer of insulating material due to the difference in diffusivity between the two materials. For example, depending upon the temperature of the thermal anneal process 112, the diffusivity of germanium in the fins 106 may be sufficiently greater than the diffusivity of the silicon dioxide layer of insulating material 104. In one illustrative embodiment, the thermal anneal process 112 may be performed at a temperature that falls within the range of about 900-1000° C., in an inert environment, for a duration of about 10-30 minutes. The thermal anneal process 112 may be performed using an RTA furnace or a traditional furnace, depending upon the particular application. The concentration of germanium in the SiGe regions 114 will likely vary from the upper surface 114U to the bottom 114B of the SiGe regions 114, i.e., a germanium gradient may likely be present. However, if the anneal process 112 is performed for a sufficiently long duration, and the "source" layer is thick enough, an effectively constant Ge % on the top portion of the fin within the region 114 can be achieved across a sufficiently long (50-100 nm) distance. As noted above, the fault lines or defects 110 in the SiGe layer 108 will likely stop at the interface between the SiGe layer 108 and the fins 106 and where they intersect with the layer of insulating material 104. Even if the defects 110 that were present in the SiGe layer 108 propagate into the original silicon fins 106, due to the angle associated with the (111) planes, those defect lines would stop close to the top 104U of the insulator layer 104 and would not reach deep into the silicon fins 106. In that sense, the proposed method functions as an "upside-down" ART process. Therefore, even for the worst-case scenario involving the defect propagation into original silicon fins 106, using the methods disclosed herein, at some location at or below the upper surface 104U of the layer of insulating material 104, the SiGe regions 114 will be a fully-strained, substantially defect-free SiGe material. Also note that, due to the spatial confinement provided by the structure of the fin 106, the fully-strained, substantially defect-free SiGe material may be available up to a thickness that is greater than the critical thickness of the material if it had been grown on an unconfined upper surface of a silicon substrate.

Figure 2D:
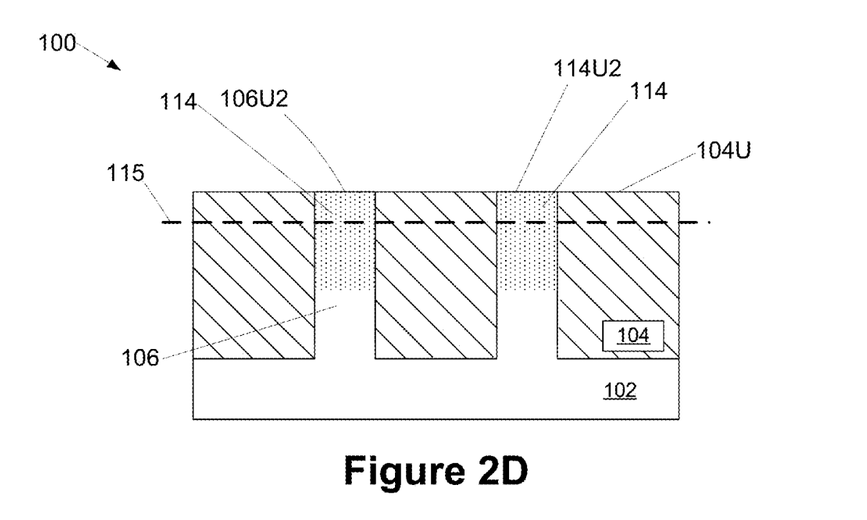

In FIG. 2D, one or more etching processes and/or CMP processes were performed to remove at least the portions of the fins 106/SiGe regions 114 positioned above the upper surface 104U of the layer of insulating material 104. In one particular embodiment, only one or more CMP processes are performed to achieve the structure depicted in FIG. 2D. After the process operations shown in FIG. 2D are completed, a lower upper surface 114U2 of the SiGe regions 114 and a lower upper surface 106U2 of the fins 106 are substantially planar with the upper surface 104U of the layer of insulating material 104. Importantly, to the extent that any of the fault lines 110 in the SiGe layer 108 did extend into the portions of the fins 106 positioned above the upper surface 104U of the layer of insulating material 104, the removal of the portions of the fins 106 shown in FIG. 2D, e.g., about 15-20 nm, should remove any of such line defects that may be present in the remaining portions of the SiGe regions 114. If desired, the removal operations described in FIG. 2D may be performed for such a duration that additional amounts of the SiGe regions 114 may be removed, i.e., the removal operations may be performed until fins 106, SiGe regions 114 and the layer of insulating material 104 are to a depth indicated by the dashed-line 115 in FIG. 2D, to thereby further insure that any fault line 110 are not present in the SiGe fins 114.

Figure 2E:
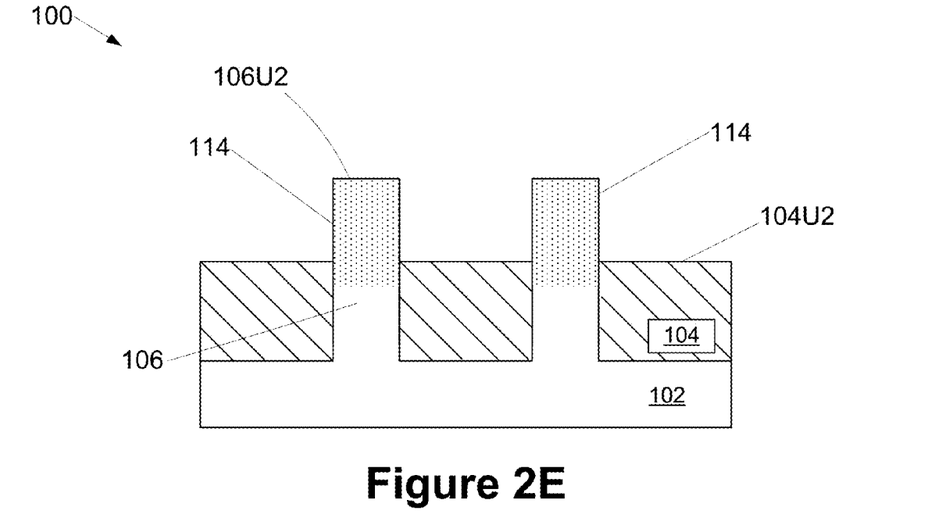

FIG. 2E depicts the device 100 after an etching process was performed on the layer of insulating material 104 to reduce its thickness and thereby result in the layer of insulating material having a further recessed surface 104U2. The recessed surface 104U2 of the layer of insulating material 104 essentially defines the final active fin height of the now silicon-germanium fins 114. The final active fin height may vary depending upon the particular application and, in one illustrative embodiment, may range from about 20-50 nm. Upon optimization of the "source" thickness, i.e., the thickness of the layer 108, the germanium percentage, and thermal anneal temperature and time, a substantially uniform material, with a high percentage of germanium, may be formed within the active fin height.

Figure 2F:
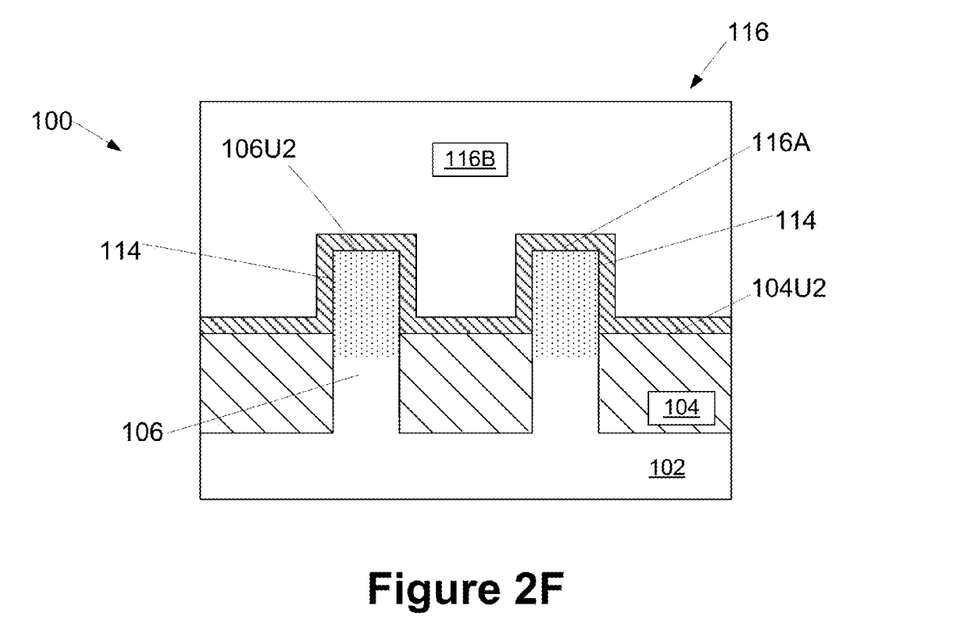

At the point of processing depicted in FIG. 2E, the illustrative FinFET device 100 may be completed using traditional fabrication techniques. For example, FIG. 2F depicts the device 100 after an illustrative gate structure 116 has been formed for the device 100. In one illustrative embodiment, the schematically depicted gate structure 116 includes an illustrative gate insulation layer 116A and an illustrative gate electrode 116B. The gate insulation layer 116A may be comprised of a variety of different materials, such as, for example, silicon dioxide, a so-called high-k (k greater than 10) insulation material (where k is the relative dielectric constant), etc. Similarly, the gate electrode 116B may also be of a material such as polysilicon or amorphous silicon, or it may be comprised of one or more metal layers that act as the gate electrode 116B. As will be recognized by those skilled in the art after a complete reading of the present application, the gate structure 116 of the device 100 depicted in the drawings, i.e., the gate insulation layer 116A and the gate electrode 116B, is intended to be representative in nature. That is, the gate structure 116 may be comprised of a variety of different materials and it may have a variety of configurations, and the gate structure 116 may be made using either the so-called "gate-first" or "replacement gate" techniques. In one illustrative embodiment, an oxidation process or a conformal deposition process may be performed to form a gate insulation layer 116A comprised of a material such as, for example, silicon dioxide, silicon nitride, hafnium oxide, a high-k (k value greater than 10) insulating material, etc., on the silicon-germanium fins 114. Thereafter, the gate electrode material 116B and a gate capping layer of material (not shown) may be deposited above the device 100 and the layers may be patterned using known photolithographic and etching techniques and planarized by known CMP techniques. Thereafter, using traditional techniques, sidewall spacers (not shown) may be formed proximate the gate structure 116 by blanket-depositing a layer of spacer material and thereafter performing an anisotropic etching process to define the spacers.

Figure 3A:
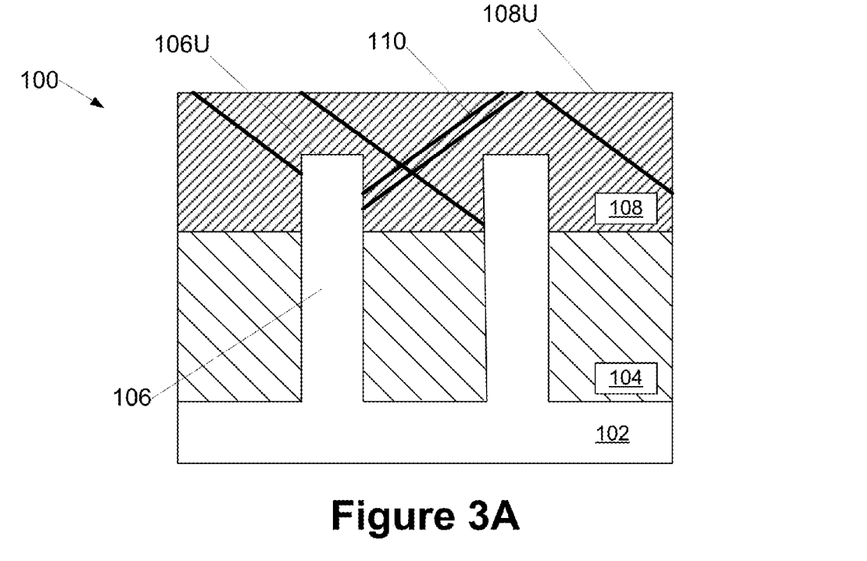
FIGS. 3A-3D depict other illustrative novel methods disclosed herein for forming substantially defect-free, fully strained silicon-germanium fins for a FinFET semiconductor device.

FIGS. 3A-3D depict other illustrative novel methods disclosed herein for forming silicon-germanium fins for a FinFET semiconductor device. FIG. 3A depicts the device 100 at a point in processing that corresponds to that depicted in FIG. 2B, i.e., after the SiGe layer 108 was formed above the device 100.

Figure 3B:
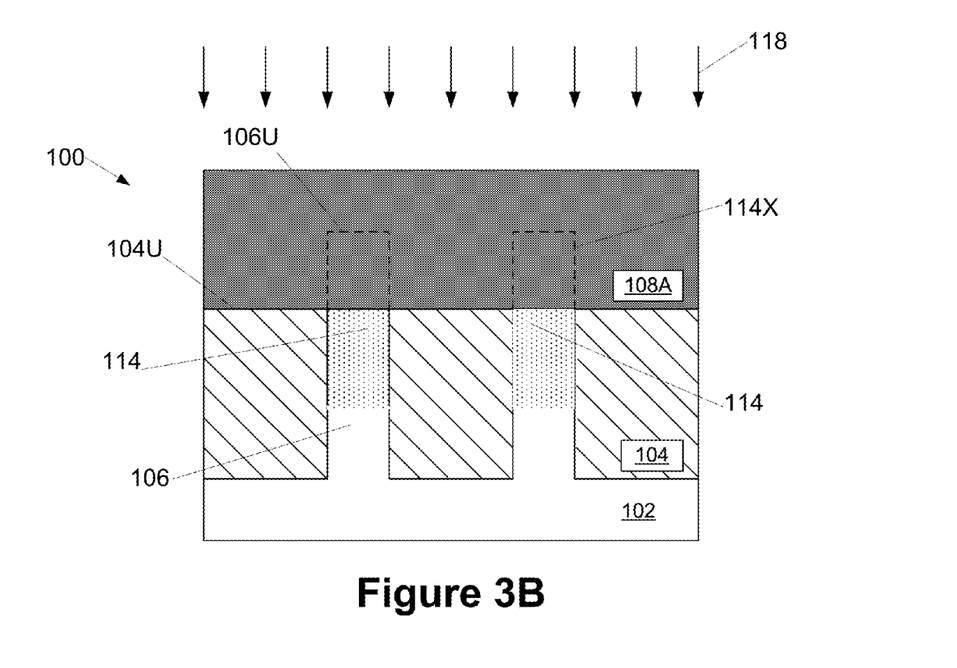

FIG. 3B depicts the device 100 after a relatively high temperature oxidation process 118 was performed on the FinFET device 100. In general, in one embodiment, the high temperature oxidation process 118 is performed under conditions such that substantially all of the SiGe layer 108 is converted into an insulating material, e.g., silicon dioxide, as indicated by the new reference number 108A and the change in shading. Also during this high temperature oxidation process 118, substantially all of the portions of the regions 114/fins 106 positioned above the upper surface 104U of the layer of insulating material 104 are also converted to silicon dioxide. A dashed line 114X depicts the outline of the region 114/fin 106 prior to performing the high temperature oxidation process. The parameters of the high temperature oxidation process 118 may vary depending upon the particular application. In one illustrative embodiment, the high temperature oxidation process 118 may be performed at a temperature that falls within the range of about 700-1100° C. in an oxidizing processing ambient (wet or dry), in an RTA furnace or a traditional furnace, depending upon the particular application. The duration of the oxidation process 118 may vary depending upon a variety of factors, e.g., it may range from minutes to hours depending upon the temperature of the process, the particular processing tools and techniques used to perform the anneal process 118, such as an RTA chamber or a traditional furnace, etc. The substantial complete oxidation of the SiGe layer 108 effectively drives or "pushes" the germanium in the SiGe layer 108 into the fins 106 to thereby form the above described SiGe regions 114.

Figure 3C:
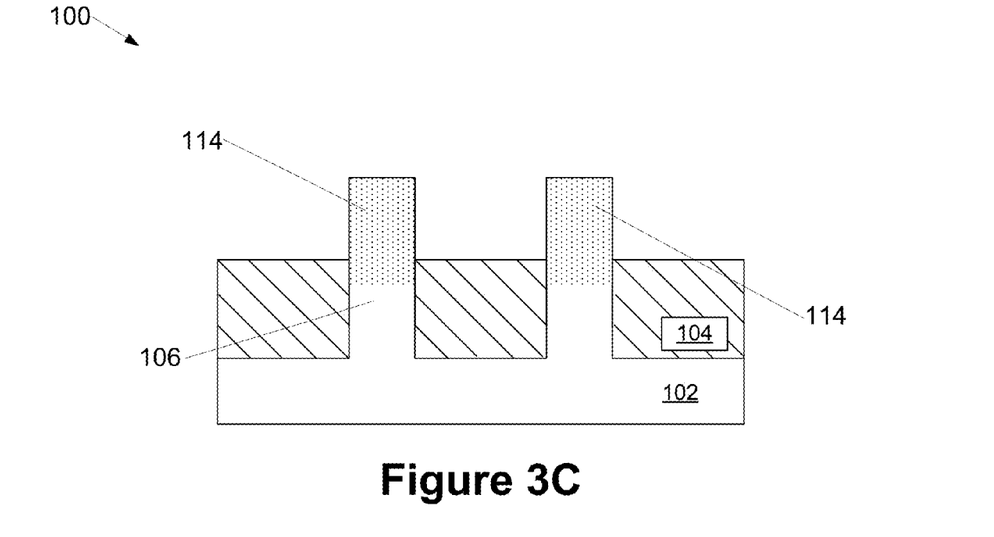

FIG. 3C depicts the device 100 after an etching process was performed to remove the converted layer of insulating material 108A and as much of the layer of insulating material 104 as desired so as to expose the desired final fin height of the now silicon-germanium fins 114.

Figure 3D:
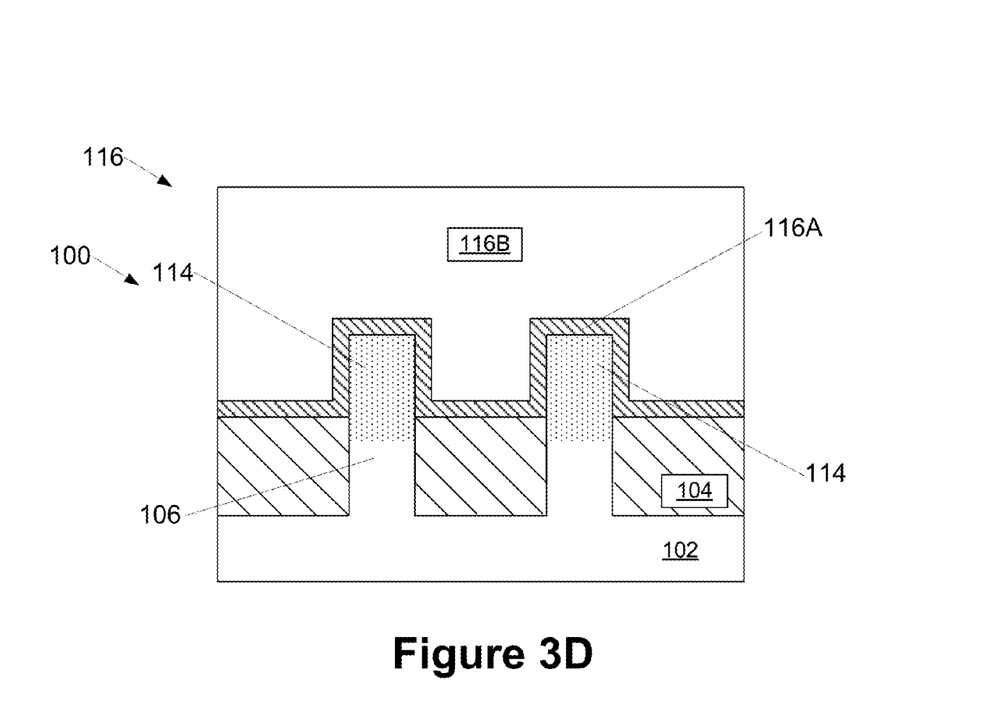

FIG. 3D depicts the device 100 after the above-described gate structure 116 was formed on the device 100.

Figure 4A:
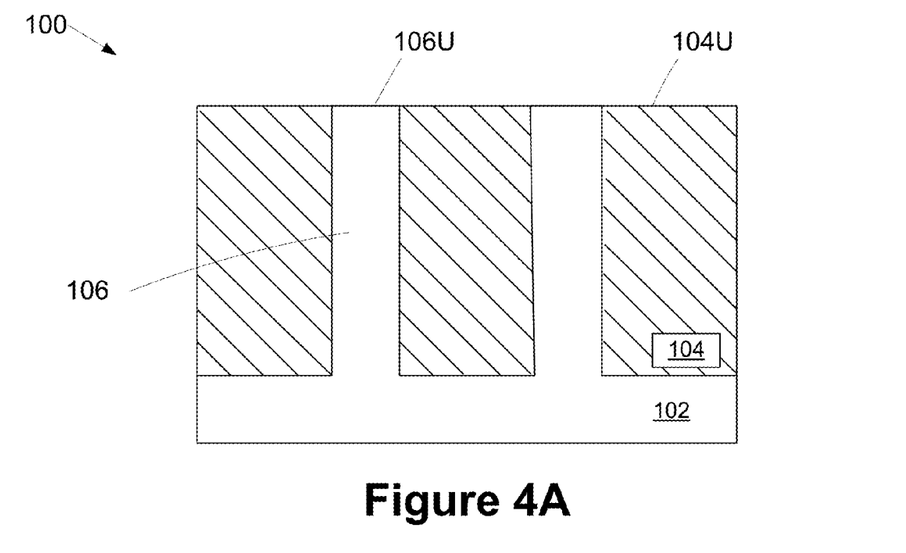
FIGS. 4A-4F depict additional illustrative novel methods disclosed herein for forming substantially defect-free, fully strained, silicon-germanium fins for a FinFET semiconductor device.

FIGS. 4A-4F depict additional illustrative novel methods disclosed herein for forming silicon-germanium fins for a FinFET semiconductor device. FIG. 4A depicts the device 100 at a point in processing that corresponds approximately to that depicted in FIG. 2A with the exception that the upper surface 104U of the layer of insulating material 104 is substantially planar with the upper surface 106U of the fins 106.

Figure 4B:
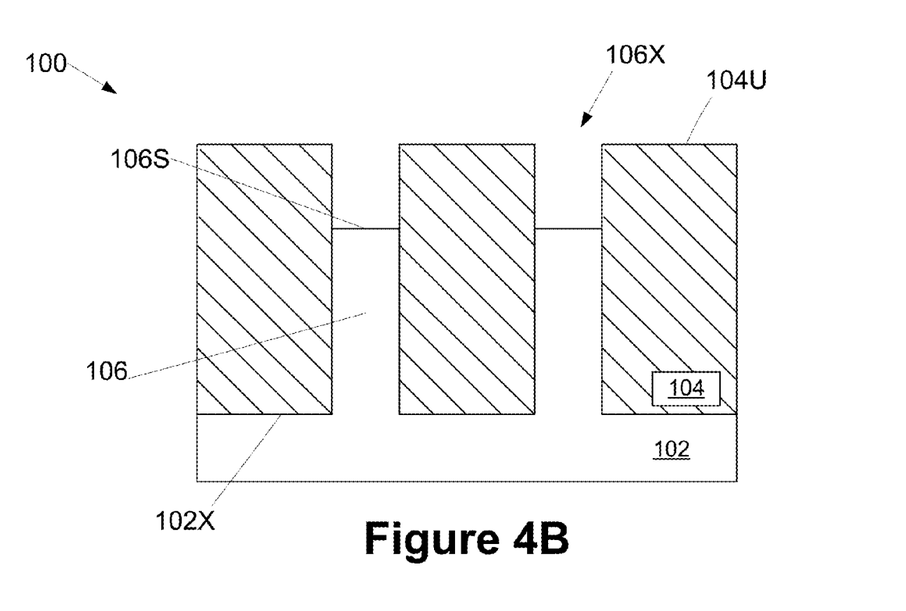

Next, as shown in FIG. 4B, one or more etching processes, wet or dry, are performed to recess portions of the fins 106 and thereby define a plurality of fin cavities 106X that expose the upper surface 106S of the fins 106 for further processing. In one illustrative embodiment, using current-day technologies, the fin cavities 106X may have a bottom width of about 10-20 nm and a height or depth of about 20-100 nm.

Figure 4C:
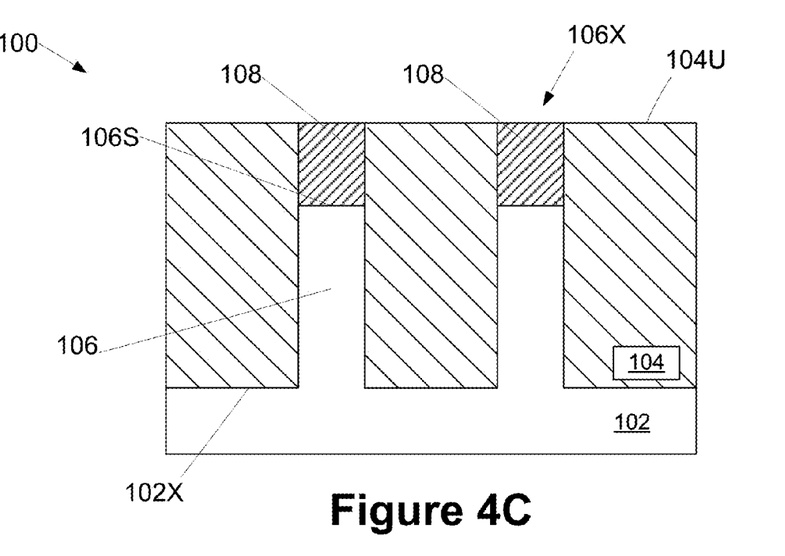

FIG. 4C depicts the device 100 after an epitaxial deposition process was performed to form the above-described SiGe layer 108 in the fin cavities 106X on the upper surfaces 106S of the fins 106. To the extent any fault lines 110 are present in the SiGe layer 108 shown in FIGS. 4A-4F, such fault lines 110 are not depicted in FIGS. 4A-4F. Additionally, the epi deposition process may be performed for such a duration that the SiGe layer 108 over-fills the fin cavities 106X. In that case, a CMP process may be performed to remove excess amounts of the SiGe layer 108 positioned outside of the fin cavities 106X.

Figure 4D:
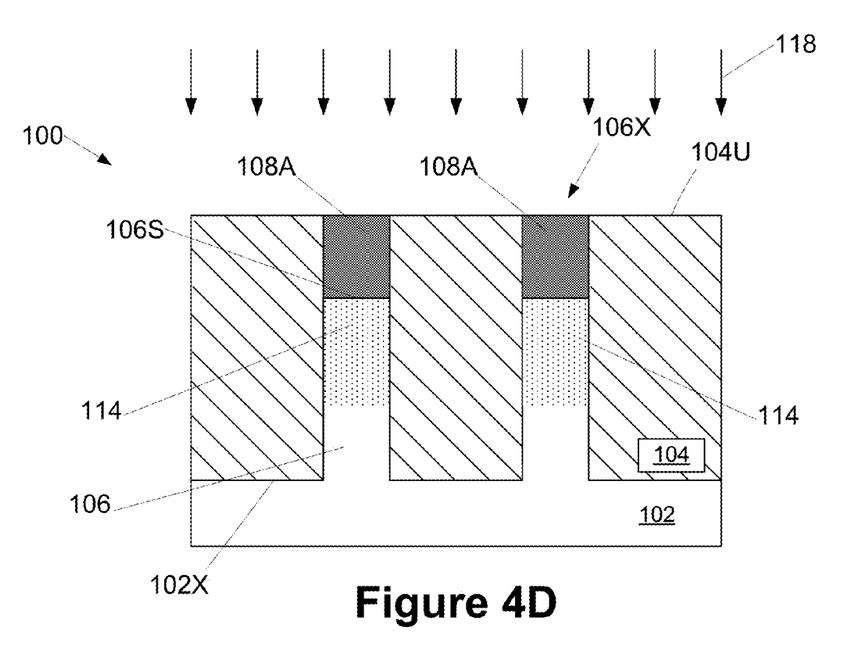

FIG. 4D depicts the device 100 after the above-described high temperature oxidation process 118 was performed on the FinFET device 100 to convert substantially all of the SiGe layer 108 in the fin cavities 106X into an insulating material, e.g., silicon dioxide, as indicated by the new reference number 108A and the change in shading. As before, the substantial complete oxidation of the SiGe layer 108 effectively drives or "pushes" the germanium in the SiGe layer 108 into the fins 106 to thereby form the above-described SiGe regions 114 in the fins 106. Both the germanium condensation and thermal diffusion processes proceed in parallel and determine the percentage of germanium and the distribution of germanium in the final SiGe fin 114.

Figure 4E:
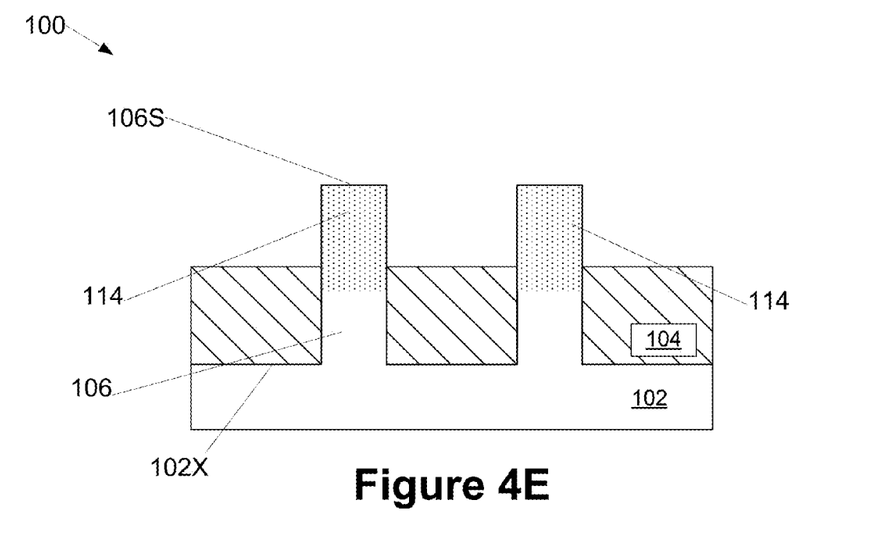

FIG. 4E depicts the device 100 after an etching process was performed to remove the converted layer of insulating material 108A and as much of the layer of insulating material 104 as desired so as to expose the desired final fin height of the now silicon-germanium fins 114.

Figure 4F:
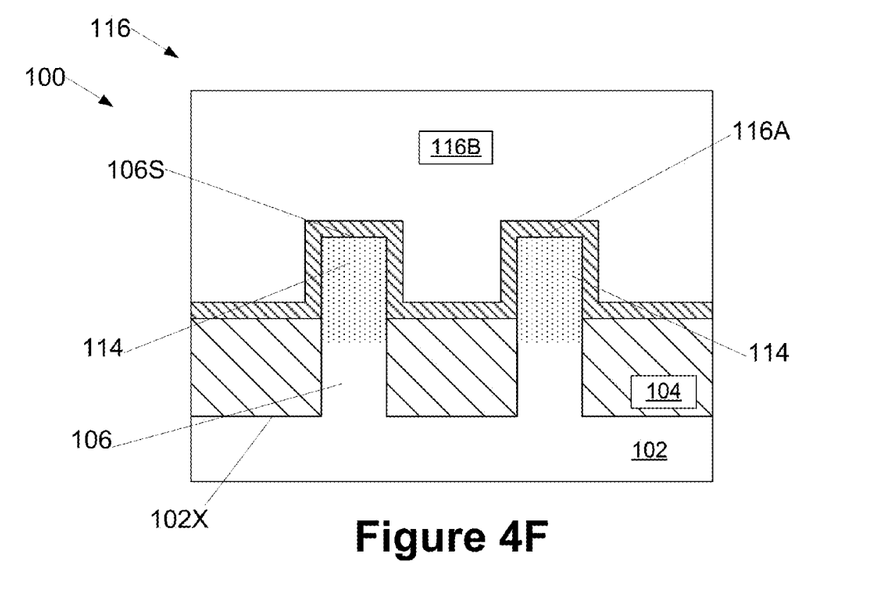

FIG. 4F depicts the device 100 after the above-described gate structure 116 was formed on the device 100.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
forming a plurality of trenches in a silicon substrate to thereby define a fin;
forming a recessed layer of insulating material in said plurality of trenches, the recessed surface of said layer of insulating material exposing an upper portion of said fin;
performing an epitaxial deposition process to form a layer of epi silicon-germanium ($Si_xGe_{1-x}$) above said recessed layer of insulating material and on the exposed portion of said fin, wherein the concentration of germanium in said layer of epi silicon-germanium ($Si_xGe_{1-x}$) ranges from 25-100%;
performing a thermal anneal process in an inert processing environment to cause germanium in said layer of epi silicon-germanium ($Si_xGe_{1-x}$) to diffuse into said fin and thereby define a substantially defect-free silicon-germanium region in said fin;
after performing said thermal anneal process, performing at least one process operation to remove said layer of epi silicon-germanium ($Si_xGe_1$);
after removing said layer of epi silicon-germanium ($Si_xGe_{1-x}$), recessing said layer of insulating material to expose at least a portion of said silicon-germanium region; and
forming a gate structure around at least a portion of the exposed silicon-germanium region.

2. The method of claim 1, wherein said germanium concentration in said silicon-germanium region ranges from 25-100%.

3. The method of claim 1, wherein said thermal anneal process is performed at a temperature that falls within the range of about 900-1000° C.

4. The method of claim 3, wherein said thermal anneal process is performed for a duration of about 10-30 minutes.

5. The method of claim 1, wherein, prior to forming said gate structure, the method comprises performing at least one process operation to remove a portion of said silicon-germanium region.

6. The method of claim 1, wherein, said gate structure is formed around a portion of said silicon-germanium region without removing any of said silicon-germanium region.

7. A method, comprising:
forming a plurality of trenches in a silicon substrate to thereby define a fin;
forming a recessed layer of insulating material in said plurality of trenches, the recessed surface of said layer of insulating material exposing a portion of said fin;
performing an epitaxial deposition process to form a layer of epi silicon-germanium ($Si_xGe_{1-x}$) above said recessed layer of insulating material and on the exposed portion of said fin, wherein the concentration of germanium in said layer of epi silicon-germanium ($Si_xGe_{1-x}$) ranges from 25-100%;
performing an oxidation process to convert at least a portion of said layer of epi silicon-germanium ($Si_xGe_{1-x}$) into an oxide and to cause germanium in said layer of epi silicon-germanium ($Si_xGe_{1-x}$) to diffuse into said fin and thereby define a substantially defect-free silicon-germanium region in said fin;
after performing said oxidation process, performing at least one removal process operation to remove the oxidized portions of said layer of epi silicon-germanium ($Si_xGe_{1-x}$) and any remaining portions of said layer of epi silicon-germanium ($Si_xGe_{1-x}$); and
after performing said at least one removal process operation, forming a gate structure around at least a portion of said silicon-germanium region.

8. The method of claim 7, wherein said germanium concentration in said silicon-germanium region ranges from 25-100%.

9. The method of claim 7, wherein said oxidation process is performed at a temperature that falls within the range of about 700-1100° C.

10. The method of claim 7, wherein, prior to forming said gate structure, the method comprises performing at least one process operation to remove a portion of said silicon-germanium region.

11. The method of claim 7, wherein said gate structure is formed around a portion of said silicon-germanium region without removing any of said silicon-germanium region.

12. A method, comprising:
forming a plurality of trenches in a silicon substrate to thereby define a fin;
forming a layer of insulating material in said plurality of trenches, said layer of insulating material having an upper surface that is substantially planar with an upper surface of said fin;
performing an etching process to remove a portion, but not all, of said fin, so as to form a fin cavity that is defined by said layer of insulating material and a recessed upper surface of said fin;
performing an epitaxial deposition process to form a layer of epi silicon-germanium ($Si_xGe_{1-x}$) in said fin cavity and on said recessed upper surface of said fin, wherein the concentration of germanium in said layer of epi silicon-germanium ($Si_xGe_{1-x}$) ranges from 25-100%;
performing an oxidation process to convert at least a portion of said layer of epi silicon-germanium ($Si_xGe_{1-x}$) into an oxide and to cause germanium in said layer of epi silicon-germanium ($Si_xGe_{1-x}$) to diffuse into said fin and thereby define a substantially defect-free silicon-germanium region in said fin;
after performing said oxidation process, performing at least one removal process operation to remove the oxidized portions of said layer of epi silicon-germanium ($Si_xGe_{1-x}$) and any remaining portions of said layer of epi silicon-germanium ($Si_xGe_{1-x}$) and to recess said layer of insulating material so as to expose at least a portion of said silicon-germanium region; and
after performing said at least one removal process operation, forming a gate structure around at least a portion of said silicon-germanium region.

13. The method of claim 12, wherein said germanium concentration in said silicon-germanium region ranges from 25-100%.

14. The method of claim 12, wherein said oxidation process is performed at a temperature that falls within the range of about 700-1100° C.

15. The method of claim 12, wherein, prior to forming said gate structure, the method comprises performing at least one process operation to remove a portion of said silicon-germanium region.

16. The method of claim 12, wherein said gate structure is formed around a portion of said silicon-germanium region without removing any of said silicon-germanium region.

* * * * *